United States Patent
Park et al.

(10) Patent No.: US 9,464,353 B2
(45) Date of Patent: Oct. 11, 2016

(54) SUBSTRATE PROCESSING APPARATUS

(71) Applicant: WONIK IPS CO., LTD., Pyeongtaek-Si, Gyeonggi-Do (KR)

(72) Inventors: Young Hoon Park, Anseong-Si (KR); Dong Ho Ryu, Hwaseong-Si (KR); Won Jun Yoon, Seoul (KR)

(73) Assignee: WONIK IPS CO., LTD. (KR)

( * ) Notice: Subject to any disclaimer, the term of this patent is extended or adjusted under 35 U.S.C. 154(b) by 506 days.

(21) Appl. No.: 14/086,959

(22) Filed: Nov. 21, 2013

(65) Prior Publication Data

US 2015/0136028 A1   May 21, 2015

(51) Int. Cl.
    *C23C 16/455*   (2006.01)

(52) U.S. Cl.
    CPC ... *C23C 16/45565* (2013.01); *C23C 16/45508* (2013.01); *C23C 16/45519* (2013.01); *C23C 16/45548* (2013.01); *C23C 16/45551* (2013.01)

(58) Field of Classification Search
    CPC ... C23C 16/45519; C23C 16/45502–16/4551; C23C 16/45523–16/45555; C23C 16/45548; C23C 16/45563–16/4558; C23C 16/45565; C23C 16/45568; C23C 16/45587–16/45591; C23C 16/458; H01J 37/3244–37/32449; H01J 2237/332–2237/3328; H01L 21/0228
    See application file for complete search history.

(56) References Cited

U.S. PATENT DOCUMENTS

| | | | |
|---|---|---|---|
| 2010/0190341 A1* | 7/2010 | Park | C23C 16/045 438/694 |
| 2010/0263588 A1* | 10/2010 | Zhiyin | C23C 16/45508 117/98 |
| 2011/0305835 A1* | 12/2011 | Bertram, Jr. | C23C 16/45568 427/255.23 |
| 2012/0152171 A1* | 6/2012 | Lee | C23C 16/45551 118/730 |

(Continued)

FOREIGN PATENT DOCUMENTS

| KR | WO 2009017322 A1 * | 2/2009 | ......... C23C 16/4412 |
|---|---|---|---|
| KR | WO 2010067974 A2 * | 6/2010 | ....... C23C 16/45565 |

(Continued)

*Primary Examiner* — Parviz Hassanzadeh
*Assistant Examiner* — Stanislav Antolin (57) ABSTRACT

The present invention relates to a substrate processing apparatus: including a chamber comprising a body having an inner space and a top lid provided on an upper part of the body, the top lid having at least one gas input port; a substrate supporting unit rotatably installed inside the chamber to support a plurality of substrates; and a gas injection device comprising a central injection unit provided on an upper part of the substrate supporting unit to inject a gas into a central region of the substrate supporting unit, a source gas injection unit provided around the central injection unit to inject a source gas into the substrate supporting unit, a reaction gas injection unit provided around the central injection unit to inject a reaction gas into the substrate supporting unit and a purge gas injection unit disposed between the source gas injection unit and the reaction gas injection unit; wherein at least one of the source gas injection unit and the reaction gas injection unit comprises a main injection unit to inject a gas into the substrate supporting unit and a gas-injecting projection projecting in a intersectional direction to the main injection unit between the central injection unit and the main injection unit, the main injection unit and the projection are divided into a plurality of regions along a circumference, and the main injection unit or the projection in at least one region inject an amount of gas different than those of the other regions. The substrate processing apparatus according to the present invention can enhance uniformity and reliability of a thin film.

12 Claims, 4 Drawing Sheets

132R : 132R1, 132R2

(56) References Cited

U.S. PATENT DOCUMENTS

2012/0152172 A1* 6/2012 Hwang ............. C23C 16/45551 118/730
2013/0260488 A1* 10/2013 Kim .................. C23C 16/45508 438/26

FOREIGN PATENT DOCUMENTS

| KR | WO 2011025214 A2 * | 3/2011 | ....... C23C 16/45551 |
| KR | WO 2011027987 A2 * | 3/2011 | ....... C23C 16/45551 |
| KR | 101028408 B1 | 4/2011 | |
| KR | WO 2012087002 A2 * | 6/2012 | ....... C23C 16/45508 |

* cited by examiner

SUBSTRATE PROCESSING APPARATUS

TECHNICAL FIELD

The present invention relates to a substrate processing apparatus. More particularly, the present invention relates to a substrate processing apparatus that can enhance uniformity and reliability of a thin film.

BACKGROUND

As a scale of semiconductor devices is reduced, a demand on a super thin film is increasingly increased. In addition, as a size of contact holes is reduced, a problem on step coverage is increasingly crucial. To overcome these problems, a method of atomic layer deposition (ALD) has been used as a method for deposition.

In brief, atomic layer deposition is performed as follows: A substrate is exposed to a feed gas supplied inside a chamber, and the feed gas is chemically adsorbed on a surface of the substrate through a reaction of the feed gas and the surface of the substrate to form a mono-atomic layer. However, if the surface of the substrate is saturated with the feed gas, the feed gas excluding the feed gas forming the mono-atomic layer is being physically adsorbed rather than being chemically adsorbed due to non-reactivity between the same ligands. Then, if the substrate is exposed to a purge gas, the feed gas being physically adsorbed on the substrate is removed by the purge gas. Then, if the substrate is exposed to a reaction gas, the reaction gas is reacted with the feed gas being chemically adsorbed on the surface of the substrate through substitution between the feed gas and ligands to form a second layer. The reaction gas that is not reacted with the first layer is being physically adsorbed, and is removed by the purge gas when the substrate is again exposed to the purge gas. At this time, a surface of the second layer is a state capable of reacting with the feed gas. A cycle of the aforementioned processes is repeated until a thin film having a desired thickness is formed.

A substrate processing apparatus for forming such an atomic layer comprises a chamber having a space unit formed therein, and a substrate supporting unit rotatably provided inside the chamber and configured to hold a plurality of substrates. Also, a gas injection device is provided in an upper part of the chamber.

The gas injection device comprises a plurality of gas injection units. More specifically, the gas injection device is configured to have a top lid, a central injection unit having a plurality of gas injection holes coupled to a lower central part of the top lid, and a plurality of processing gas and purge gas injection units having a plurality of gas injection holes coupled to a lower part of the top lid, these injection units are formed as a fan-like shape along a circumference of the central injection unit. The top lid has also a plurality of gas injection holes, and each of gas injection holes is communicated with the gas injection holes formed in each injection unit.

The substrate supporting unit is installed such that it elevates and rotates inside the chamber, so that gases injected from each injection unit may be sequentially supplied to a plurality of substrates during deposition of a thin film. For example, a feed gas is supplied to a substrate at the time when a procedure starts, and subsequently a purge gas, a reaction gas and a purge gas are sequentially supplied to the substrate to achieve deposition of a thin film.

The central injection unit provided in a central part of the gas injection device injects the purge gas to prevent the feed gas and the reaction gas from being mixed at a central part of the substrate supporting unit. However, the purge gas injected from the central injection unit acts to push the feed gas and the reaction gas toward an edge direction of the substrate supporting unit, amounts of the feed gas and the reaction gas are relatively low in the central part of the substrate supporting unit, and residence time is also shortened. Thus, since a thin film is not smoothly deposited on a substrate adjacent the central part among substrates mounted on the substrate supporting unit, it is difficult to deposit a thin film having a desired thickness throughout the substrate. Further, since uniformity of a thin film is decreased, there is a problem that reliability and productivity of devices produced are reduced.

PRIOR ART DOCUMENT

Patent Document (Patent Document 1) KR 1028408 B

SUMMARY OF THE INVENTION

Technical Problem

The present invention provides a substrate processing apparatus that can enhance deposition uniformity of a thin film.

The present invention also provides a substrate processing apparatus that can enhance quality and productivity of a thin film.

Technical Solution

According to an exemplary embodiment, a substrate processing apparatus includes: a chamber comprising a body having an inner space and a top lid provided on an upper part of the body, the top lid having at least one gas input port; a substrate supporting unit rotatably installed inside the chamber to support a plurality of substrates; and a gas injection device comprising a central injection unit provided on an upper part of the substrate supporting unit to inject a gas into a central region of the substrate supporting unit, a source gas injection unit provided around the central injection unit to inject a source gas into the substrate supporting unit, a reaction gas injection unit provided around the central injection unit to inject a reaction gas into the substrate supporting unit and a purge gas injection unit disposed between the source gas injection unit and the reaction gas injection unit; wherein at least one of the source gas injection unit and the reaction gas injection unit comprises a main injection unit to inject a gas into the substrate supporting unit and a gas-injecting projection projecting in a intersectional direction to the main injection unit between the central injection unit and the main injection unit, the main injection unit and the projection are divided into a plurality of regions along a circumference, and the main injection unit or the projection in at least one region inject an amount of gas different than those of the other regions.

The central injection unit is coupled to a lower central part of the top lid, a plurality of gas injection holes are formed on a lower surface of the central injection unit, the source gas injection unit and the reaction gas injection unit are provided along a circumference of the central injection unit partially in a lower part of the top lid, and a plurality of gas injection holes may be formed on a side surface of the projection and a lower surface of the main injection unit.

The projection and the main injection unit are connected to a gas supplier that controls gas supply, and the projection and the main injection unit may be connected to different gas suppliers.

The projection and the main injection unit are connected to a gas supplier that controls gas supply, and the projection and the main injection unit may be connected to the same gas supplier.

The gas supplier comprises a controller to control supply of the source gas or the reaction gas to the projection and the main injection unit and a controller to control a carrier gas, and the carrier gas may be an inert gas or N2 gas.

At least one region among the plurality of regions of the projection may have gas injection holes more than those of the other regions.

At least one region among the plurality of regions of the projection may have gas injection holes larger than those of the other regions.

The projection has a flow path therein which is communicated with at least one of a plurality of the gas input ports, and a plurality of gas injection holes may be formed on a side surface of the projection to communicate with the flow path.

The gas injection holes formed in the projection may be inclined toward the substrate supporting unit.

The gas injection holes formed in the projection may have larger cross-sectional area in one side that gas is discharged relative to another side that is connected to the flow path.

The gas injection holes of the projection may be formed in a region of 10 to 80° in an angle between the lower surface of the main injection unit and a central axis of the gas injection holes.

Advantageous Effects

According to exemplary embodiments, it is possible to provide a substrate processing apparatus that can prevent a purge gas injected from a central injection unit from being input into a region where a feed gas is injected by forming a shielding film between the central injection unit and a feed gas injection unit. Also, it is possible to improve deposition uniformity and quality of a thin film by controlling partially an amount of gas injected from gas injection units that inject a processing gas such as a feed gas or a reaction gas. Thus, by supplying a feed gas enough at a central part of a substrate supporting unit and enhancing purge ability, reduced thickness or poor quality can be suppressed for a thin film deposited on a substrate placed at the central part of the substrate supporting unit.

BRIEF DESCRIPTION OF THE INVENTION

BEST MODE FOR CARRYING OUT THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Now, preferred embodiments will be described with reference to the accompanying drawings.

Figure 1:
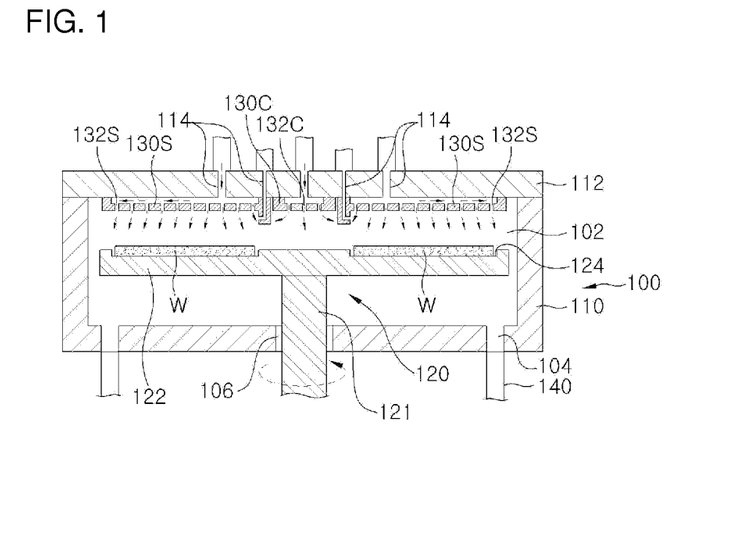
FIG. 1 shows a schematic cross-sectional view of a substrate processing apparatus according to an embodiment of the present invention.
Figure 2:
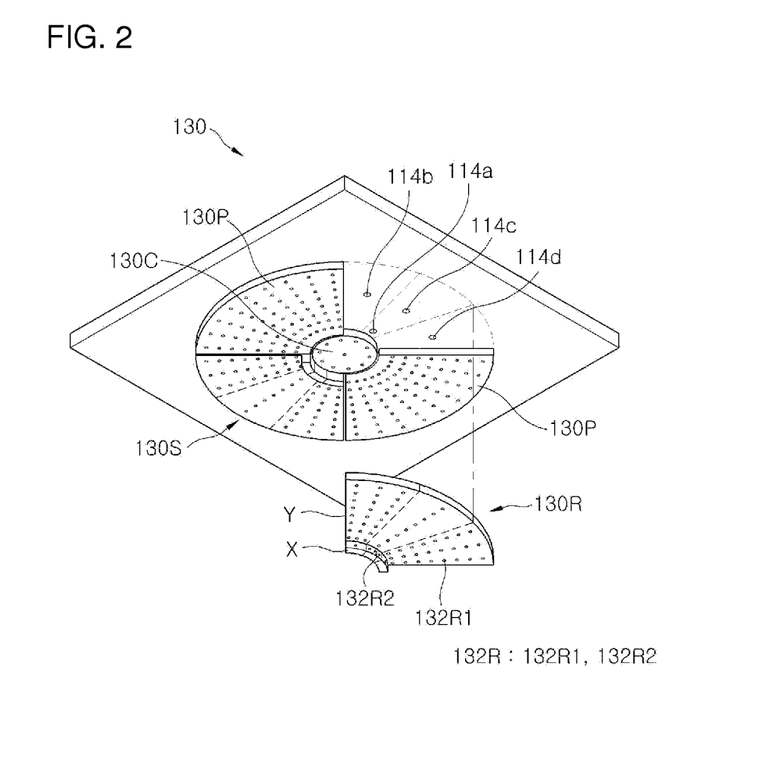
FIG. 2 shows a perspective view of a gas injection device according to an embodiment of the present invention.
Figure 3:
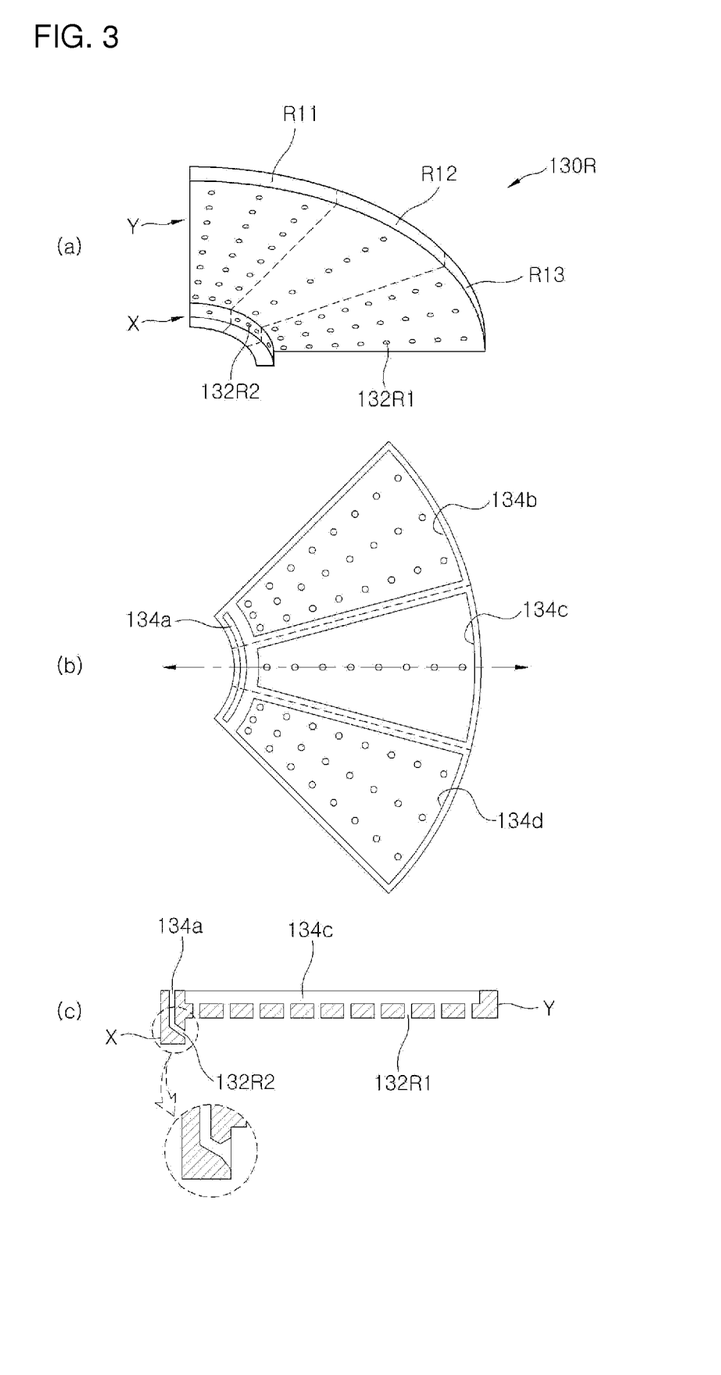
FIG. 3 shows a plane view and a cross-sectional view of a processing gas injection unit shown in FIG. 2.
Figure 4:
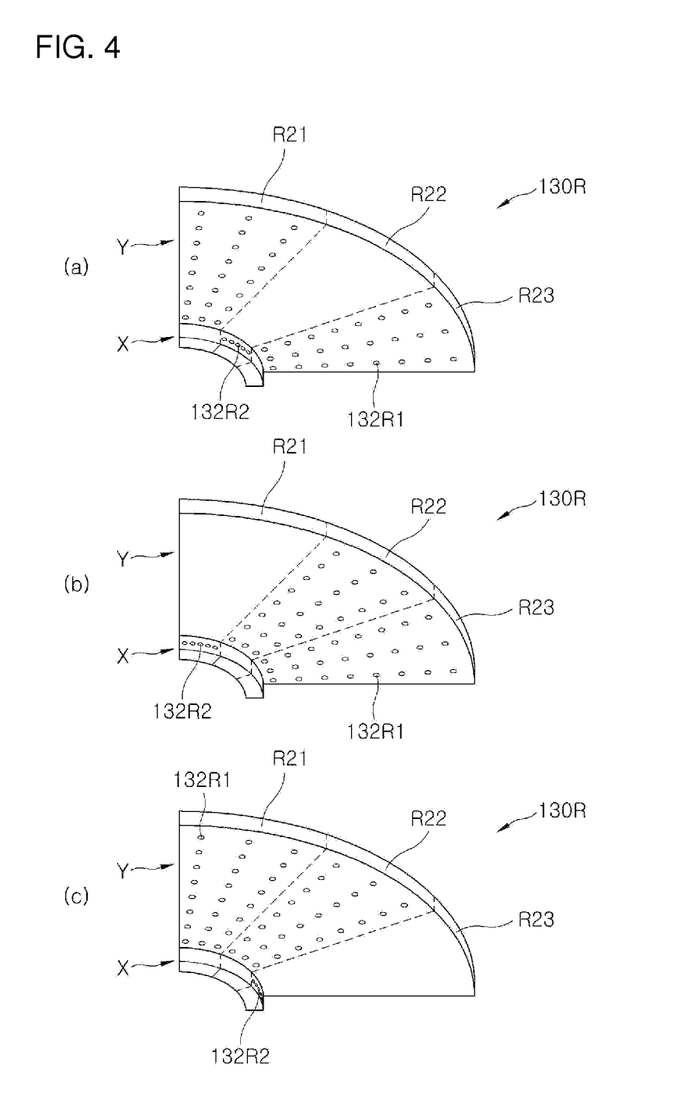
FIG. 4 shows a perspective view of a processing gas injection unit according to a modification of the present invention.

FIG. 1 shows a schematic cross-sectional view of a substrate processing apparatus according to an embodiment of the present invention; FIG. 2 shows a perspective view of a gas injection device according to an embodiment of the present invention; FIG. 3 shows a plane view and a cross-sectional view of a processing gas injection unit shown in FIG. 2; and FIG. 4 shows a perspective view of a processing gas injection unit according to a modification of the present invention.

Referring to FIG. 1, the substrate processing apparatus according to an embodiment of the present invention includes a chamber 100, a substrate supporting unit 120 and a gas injection device 130.

The chamber 100 comprises a body 110 having opened upper part and a top lid 112 installed on the upper part of the body 110 in a reclosable manner, the top lid having a plurality of gas input ports 114. When the top lid 112 is coupled to the upper part of the body 110 to close an interior of the body 110, a space unit 102 is formed inside the chamber 100 and a process on a substrate (W), for example such as a deposition process is performed therein.

Since the space unit 102 is generally formed as a vacuum condition, an exhaust port 104 is formed at a desired position of the chamber 100 to discharge gas present in the space unit 102 and the exhaust port 104 is connected to an exhaust pipe 140 that is connected to a pump (not shown) provided outside.

Also, a through-hole 106 is formed on a bottom surface of the body 110, into which a rotation axis 121 of the substrate supporting unit 120 is inserted as described below. A gate valve (not shown) is formed on a sidewall of the body 110 to transfer the substrate (W) inside or outside the chamber 100.

The substrate supporting unit 120 comprises a supporting plate 122 and a rotation axis 121 to support the substrate (W). The supporting plate 122 is a disc shape, and is horizontally provided inside the chamber 100. The rotation axis 121 is vertically connected to a bottom surface of the supporting plate 122. The rotation axis 121 is connected to a driving means (not shown) such as a motor outside the through-hole 106 to elevate and rotate the supporting plate 122. Herein, a bellows (not shown) may be provided between the rotation axis 121 and the through-hole 106 to close tightly them, thereby preventing vacuum in the chamber 100 being released during deposition of a thin film.

Also, a plurality of substrate holding units 124 are formed in an upper part of the supporting plate 122 at a constant interval. Preferably, these substrate holding units 124 may have a recess shape such that the substrate (W) can be retained therein when rotating the supporting plate 122 during deposition of a thin film. Herein, for a substrate mounted on the substrate holding unit 124, a center of the supporting plate 122, that is, a substrate portion placed in a central direction of the substrate supporting unit 120 is designated as a substrate inner side, and a substrate portion placed in an edge direction of the substrate supporting unit 120 is designated as a substrate outer side. Also, a heater (not shown) may be provided in a lower side or an inside of the supporting plate 122 to heat the substrate (W) at a constant processing temperature.

The gas injection device 130 is spaced from an upper part of the substrate supporting unit 120, and injects a processing gas such as a feed gas (S), a reaction gas (R) or a purge gas (P) toward the substrate supporting unit 120.

Referring to FIG. 2, the gas injection device 130 is a shower-head type, and comprises a central injection unit 130C that is coupled to a lower central part of the top lid 112 and a plurality of gas injection units 130S, 130R, 130P that are coupled along a circumference of the central injection unit 130C in a lower part of the top lid 112. The plurality of gas injection units 130S, 130R, 130P may be divided into processing gas injection units 130S, 130R to inject a processing gas such as a reaction gas and a plurality of purge gas injection units 130P. Herein, the top lid 112 and the substrate supporting unit 120 may not be concentrically disposed, but it is considered that the top lid 112 and the substrate supporting unit 120 are concentrically disposed when each gas injection unit is coupled. In addition, since the central injection unit 130C is coupled to the central part of the top lid 112, a center of the top lid 112, a center of the central injection unit 130C and a center of the substrate supporting unit 120 are regarded as being matched each other, and hereinafter are interchangeably used. Also, a central part of the top lid 112, a central part of the central injection unit 130C and a central part of the substrate supporting unit 120 are intended to mean an area comprising each center and a region spaced from the center to a desired distance, and a central direction is intended to mean a direction toward each center.

The central injection unit 130C is formed as a hollow cylindrical shape having an opened upper part, and a plurality of gas injection holes 132C are formed in a lower part of the central injection unit 130C. Each of the gas injection units 130S, 130R, 130P has an opened upper part and an inner space in which gas is diffused. Also, these units are formed as a fan-like shape, and a plurality of gas injection holes 132S, 132R, 132P are formed in a lower part of the gas injection units to inject a gas. The gas injection units 130S, 130R, 130P are respectively arranged along a circumference of the central injection unit 130C to form a circular shape. Also, the gas injection holes 132C, 132S, 132R, 132P formed in each gas injection unit are respectively communicated with the gas input port 114 that injects a gas suitable for each gas injection unit.

The central injection unit 130C is coupled to a lower central part of the top lid 112 to form a space in which gas is diffused therebetween, and each of the gas injection units 130S, 130R, 130P is coupled to a lower part of the top lid 112 in such a way that it occupies partially the lower part of the top lid 112 along a circumference of the central injection unit 130C. The central injection unit 130C injects a purge gas acting as an air curtain that prevent different gases injected from the processing gas injection units 130S, 130R among the plurality of the gas injection units 130S, 130R, 130P being mixed at a central part of the substrate supporting unit 120. In other words, during a procedure, processing gases are discharged to the exhaust port 104 via an exhaust flow path (not shown) formed in an edge direction of the substrate supporting unit 120, and are moved toward an edge of the substrate supporting unit 120, but gases may be mixed at the central part of the substrate supporting unit 120 due to a difference in pressure gradient formed between the substrate supporting unit 120 and the gas injection device 130. Therefore, the central injection unit 130C is provided in the central part of the substrate supporting unit 120 to inject a purge gas as a curtain gas, so that a risk of different processing gases being mixed at the central part of the substrate supporting unit 120 can be suppressed.

The processing gas injection units 130S, 130R inject processing gases to form substantially a thin film, and comprise a feed gas injection unit 130S having a plurality of feed gas injection holes 132S for injecting a feed gas and a reaction gas injection unit 130R having a plurality of reaction gas injection holes 132R for injecting a reaction gas. The purge gas injection unit 130P is disposed between the feed gas injection unit 130S and the reaction gas injection unit 130R, and has a plurality of purge gas injection holes 132P to inject a purge gas. The purge gas injection unit suppresses a mixing of a feed gas and a reaction gas in a radial direction of the substrate supporting unit 120, and removes residues produced on a substrate during a procedure. Since the gas injection device 130 thus formed pushes the feed gas and the reaction gas injected from the processing gas injection units 130S, 130R in an edge direction of the substrate supporting unit 120 by the purge gas injected from the central injection unit 130C provided in a central part of the gas injection device 130, amounts of the feed gas and the reaction gas are unnecessarily reduced in the central part of the substrate supporting unit 120, and purge ability by circular rotation movement is most weakened in the central part of the substrate supporting unit. To avoid this problem, according an embodiment of the present invention, the processing gas injection units 130S, 130R is configured to include a main injection unit (Y) that injects a gas into the substrate (W), i.e. the substrate supporting unit 120 and a projection (X) projecting in an intersectional direction to a main injection unit (Y), i.e. downwardly between the central injection unit 130C and the processing gas injection units 130S, 130R. Herein, the projection (X) may be formed orthogonally or slantly to a lower surface of the main injection unit (Y).

The projection (X) of the processing gas injection units 130S, 130R is formed with projecting downwardly in a region where the central injection unit 130C and the processing gas injection units 130S, 130R are opposite each other. The projection (X) minimizes a risk of quality of a thin film deposited on the substrate (W) adjacent the central part of the substrate supporting unit 120 being reduced by a portion of the purge gas, i.e. the curtain gas injected from the central injection unit 130C that is input into processing gas injection regions in which processing gases are injected. Thus, it is minimized that partial pressures of the processing gases are excessively reduced in the central part of the substrate supporting unit 120 or an excessive purge is produced in the central part of the substrate supporting unit 120. Herein, the projection (X) and the main injection unit (Y) are divided into a plurality of regions R11, R12, R13, for example three regions along a circumference of the gas injection device 130, and the number or size of the gas injection holes is varied for each region to control an amount of gas in each region. Thus, the projection (X) and the main injection unit (Y) can inject different amounts of gases in each divided region.

Referring to FIG. 3, the projection (X) may be formed as an arc shape along a circumference of a lower surface in one end of the processing gas injection units 130S, 130R adjacent to the central injection unit 130C. Herein, the projection (X) may be formed in at least one injection unit of the feed gas injection unit 130S and the reaction gas injection unit 130R. The projection (X) may be formed in a region where the central injection unit 130C and the processing gas injection units 130S, 130R are opposite each other, for example a region where the central injection unit 130C and the feed gas injection unit 130R are opposite each other, or regions where the central injection unit 130C and the feed gas injection unit 130S are opposite each other and the central injection unit 130C and the reaction gas injection unit 130R are opposite each other. If necessary, the projection (X) may be formed in the purge gas injection unit 130P. These projections (X) may be integrally formed with the main injection unit (Y), or may be realized by forming a structure projecting between the central injection unit 130C and the processing gas injection units 130S, 130R in the top lid 112.

In addition, a flow path 134a is formed in an interior of the projection (X) to communicate with one of the plurality of the gas input ports 114 formed in the top lid 112, and a plurality of gas injection holes 132R2 may be formed on a side surface of the flow path 134a of the projection (X) to communicate with the flow path 134a. The flow path 134a is formed separately from gas diffusion regions 134b, 134c, 134d that are formed between the top lid 112 and the reaction gas injection unit 130R or the feed gas injection unit 130S. Hereinafter, it will be described with respect to the reaction gas injection unit 130R. The gas injection holes 132R2 of the projection (X) are formed to supply additionally a reaction gas to a reaction gas injection region, so that the reaction gas is sufficiently supplied in the central part of the substrate supporting unit 120 to perform smoothly deposition of a thin film. The gas injection holes 132R2 of the projection (X) may be inclined downwardly toward the substrate supporting unit 120. Herein, the gas injection holes 132R2 may be formed on an inner surface in the range of 10 to 80° in an angle between a lower surface of the main injection unit (Y) and a central axis of the gas injection holes 132R2. Thus, gases injected from the gas injection hole 132R2 of the projection (X) can be smoothly diffused from the central part to the edge along a radial direction of the substrate supporting unit 120. Moreover, the gas injection holes 132R2 of the projection (X) may be formed with increased cross-sectional area in a direction that gases are discharged to facilitate gas diffusion into the reaction gas injection region.

The main injection unit (Y) is horizontally extended at one side of the projection (X), and a plurality of gas injection holes 132R1 are formed on a lower surface of the main injection unit (Y). The main injection unit (Y) may have gas diffusion spaces 134b, 134c, 134d for each divided region on an upper surface of the main injection unit (Y). The plurality of the gas diffusion space 134b, 134c, 134d formed in the main injection unit (Y) are respectively communicated with each of gas input ports 114b, 114c, 114d formed in the top lid 112.

An amount of gas injected can be controlled using the processing gas injection units thus formed, for example the reaction gas injection unit 130R as described below. The reaction gas injection unit 130R is divided into a plurality of regions R11, R12, R13, for example three regions, and the number of the gas injection holes 132R1, 132R2 formed for each region is adjusted to control an amount of gas injected.

For example, the number of the gas injection holes 132R1 formed in the main injection unit (Y) of the median region R12 may be smaller than the number of the gas injection holes 132R1 formed in both side regions R11, R13 of the median region R12, and the number of the gas injection hole 132R2 formed in the projection (X) of the median region R12 may be larger than the number of the gas injection holes 132R2 formed in both side regions R11, R13 of the median region R12. In this case, when an amount of gas injected from the main injection unit (Y) of the median region R12 is relatively smaller than an amount of gas injected from the main injection unit (Y) of both side regions R11, R13, an amount of gas injected from the projection (X) of the median region R12 may be relatively larger than an amount of gas injected from the projection (X) of both side regions R11, R13 to control uniformly amounts of gases injected from each region. Thus, by differentiating the number of the gas injection holes 132R1, 132R2 for each region, it can be blocked that a portion of the curtain gas injected from the central injection unit 130C is input into the processing gas injection regions in which processing gases are injected, as well as the substrate supporting unit 120 is rotated during deposition of a thin film to suppress a reduction in uniformity of a thin film due to concentration of processing gases in the processing gas injection regions.

Herein, it is described that the number of the gas injection holes 132R1, 132R2 is adjusted to control an amount of gas, but the size of the gas injection holes 132R1, 132R2 may be adjusted to control an amount of gas injected. Also, an amount of gas injected from each of all divided regions may be differently adjusted.

The reaction gas injection unit 130R may have a region that the gas injection holes 132R1, 132R2 are not formed. As shown in FIG. 4, the reaction gas injection unit 130R is divided into a plurality of regions R21, R22, R23, for example three regions. The gas injection holes 132R2 may be formed only in the median region R22 of the projection (X), and the gas injection holes 132R1 may be not formed only in the median region R22 of the main injection unit (Y). Also, as shown in (b) and (c) of FIG. 4, the gas injection holes 132R2 may be formed only in either one (R21 or R23) of both regions R21, R23 of the projection (X), and the gas injection holes 132R1 may be not formed in a region of the main injection unit (Y) corresponding to the region (R21 or R23) of the projection (X) that the gas injection holes 132R2 are formed.

Herein, it is described that the reaction gas injection unit 130R is substantially one injection unit and virtually divided into a plurality of regions, and it may be formed by coupling a plurality of injection units. As such, the projection (X) and the main injection unit (Y) are divided into a plurality of regions along a circumference of the gas injection device 130, and the number or size of the gas injection holes 132R1, 132R2 is differentially formed for each region to control an amount of gas injected into the processing gas injection region, thereby enhancing uniformity of a thin film.

Figure 5:
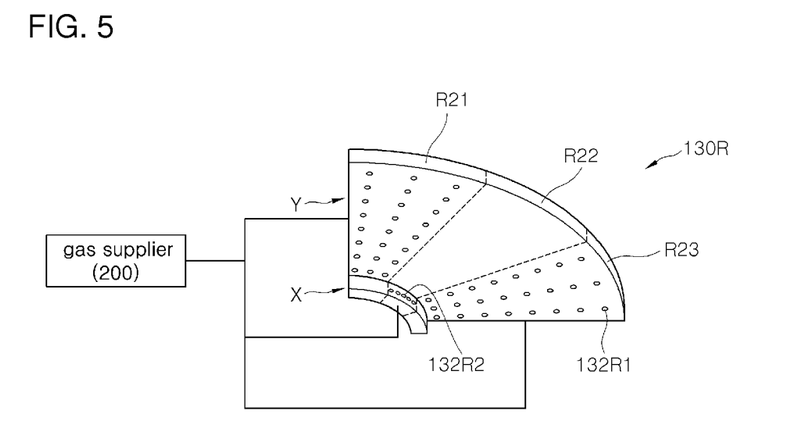
FIGS. 5 and 6 are views illustrating how gases are supplied to processing gas injection units.
Figure 6:
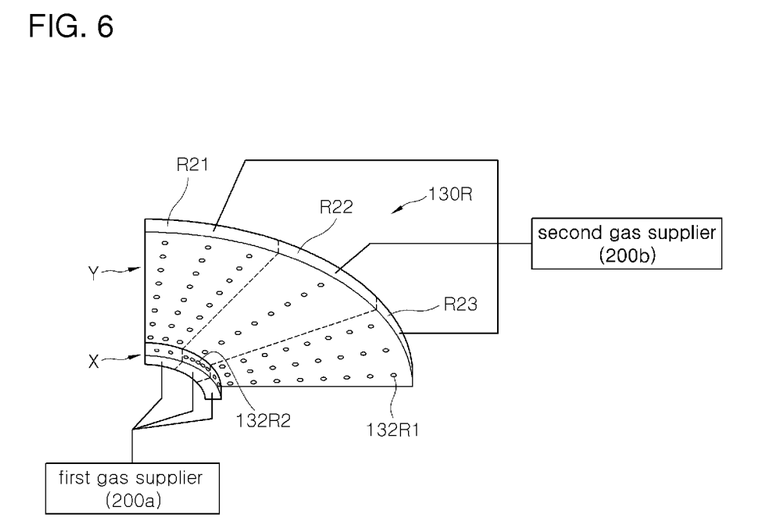

FIGS. 5 and 6 are views illustrating how gases are supplied to the processing gas injection units. In the processing gas injection unit 130S, 130R, the flow path 134a and the gas diffusion spaces 134b, 134c, 134d, which are respectively formed in the projection (X) and the main injection unit (Y), may be independently communicated with different gas input ports 114a, 114b, 114c, 114d. Herein, the same type of gases, for example a mixed gas of a feed gas or a reaction gas and a carrier gas such as argon (Ar) or nitrogen (N2) may be supplied to the gas input ports 114a, 114b, 114c, 114d that are communicated with the projection (X) and the main injection unit (Y). In this case, as shown in FIG. 5, the gas input ports 114a, 114b, 114c, 114d, which are respectively connected to the projection (X) and the main injection unit (Y), may be connected to one gas supplier 200. The gas supplier 200 may comprises a reservoir (not shown) to store a feed gas or a reaction gas, a reservoir (not shown) to store a carrier gas, a controller (not shown) to control supply of the feed gas or the reaction gas, and a controller (not shown) to control supply of the carrier gas. The gas supplier 200 thus formed can simultaneously adjust amounts of gases supplied to the processing gas injection units 130S, 130S, for example to the gas input ports 114a, 114b, 114c, 114d of the reaction gas injection unit 130R.

In the processing gas injection unit 130S, 130R, the flow path 134a and the gas diffusion spaces 134b, 134c, 134d, which are respectively formed in the projection (X) and the main injection unit (Y), may be independently communicated with different gas input ports 114a, 114b, 114c, 114d. Herein, the same type of gases, for example a mixed gas of a feed gas or a reaction gas and a carrier gas such as argon (Ar) or nitrogen (N2) may be supplied to the gas input ports 114a, 114b, 114c, 114d that are communicated with the projection (X) and the main injection unit (Y).

The projection (X) and the main injection unit (Y) may be respectively connected to different gas suppliers 200a, 200b. In this case, the gas input port 114a of the projection (X) may be connected to a first gas supplier 200a to control supply of the feed gas or the reaction gas, and the gas input ports 114b, 114c, 114d of the main injection unit (Y) may be connected to a second gas supplier 200b to control supply of the feed gas or the reaction gas. Thus, an amount of gas injected into the projection (X) and the main injection unit (Y) can be accurately controlled to enhance efficiency of thin film deposition.

Although the substrate processing system has been described with reference to the specific embodiments, it is not limited thereto. Therefore, it will be readily understood by those skilled in the art that various modifications and changes can be made thereto without departing from the spirit and scope of the present invention defined by the appended claims and equivalents thereof.

| Description of reference numbers | |
|---|---|
| 100: chamber | 102: space unit |
| 104: exhaust port | 106: through-hole |
| 110: body | 112: top lid |
| 114: gas input port | 120: substrate supporting unit |
| 121: rotation axis | 122: supporting plate |
| 124: substrate holding unit | 130C: central injection unit |
| 130S: feed gas injection unit | 130R, 230R: reaction gas injection unit |
| 130P, 230P: purge gas injection unit | 132C, 132S, 132R: gas injection hole |
| 134a: flow path | 134b, 134c, 134d: gas diffusion space |
| 200: gas source | X: projection |
| Y: main injection unit | V1, V2, V3: valve |

The invention claimed is:

1. A substrate processing apparatus including:
a chamber comprising a body having an inner space and a top lid provided on an upper part of the body, the top lid having at least one gas input port;
a substrate supporting unit rotatably installed inside the chamber to support a plurality of substrates; and
a gas injection device comprising a central injection unit provided on an upper part of the substrate supporting unit to inject a gas into a central region of the substrate supporting unit, a source gas injection unit provided around the central injection unit to inject a source gas into the substrate supporting unit, a reaction gas injection unit provided around the central injection unit to inject a reaction gas into the substrate supporting unit and a purge gas injection unit disposed between the source gas injection unit and the reaction gas injection unit;
wherein at least one of the source gas injection unit and the reaction gas injection unit comprises a main injection unit to inject a gas into the substrate supporting unit and a gas-injecting projection projecting in a intersectional direction to the main injection unit between the central injection unit and the main injection unit, the main injection unit and the projection are divided into a plurality of regions along a circumference, and the main injection unit or the projection in at least one region inject an amount of gas different than those of the other regions.

2. The substrate processing apparatus of claim 1,
wherein the central injection unit is coupled to a lower central part of the top lid,
a plurality of gas injection holes are formed on a lower surface of the central injection unit, the source gas injection unit and the reaction gas injection unit are provided along a circumference of the central injection unit partially in a lower part of the top lid, and
a plurality of gas injection holes may be formed on a side surface of the projection and a lower surface of the main injection unit.

3. The substrate processing apparatus of claim 1,
wherein the projection and the main injection unit are connected to a gas supplier that controls gas supply, and
the projection and the main injection unit may be connected to different gas suppliers.

4. The substrate processing apparatus of claim 1,
wherein the projection and the main injection unit are connected to a gas supplier that controls gas supply, and
the projection and the main injection unit may be connected to the same gas supplier.

5. The substrate processing apparatus of claim 3,
wherein the gas supplier comprises a controller to control supply of the source gas or the reaction gas to the projection and the main injection unit and a controller to control a carrier gas, and the carrier gas may be an inert gas or N2 gas.

6. The substrate processing apparatus of claim 2,
wherein at least one region among the plurality of regions of the projection may have gas injection holes more than those of the other regions.

7. The substrate processing apparatus of claim 2,
wherein at least one region among the plurality of regions of the projection may have gas injection holes larger than those of the other regions.

8. The substrate processing apparatus of claim 2,
wherein the projection has a flow path therein which is communicated with at least one of a plurality of the gas input ports, and a plurality of gas injection holes may be formed on a side surface of the projection to communicate with the flow path.

9. The substrate processing apparatus of claim 2,
wherein the gas injection holes formed in the projection may be inclined toward the substrate supporting unit.

10. The substrate processing apparatus of claim 9,
wherein the gas injection holes formed in the projection may have larger cross-sectional area in one side that gas is discharged relative to another side that is connected to the flow path.

11. The substrate processing apparatus of claim 10,
wherein the gas injection holes of the projection may be formed in a region of 10 to 80° in an angle between the lower surface of the main injection unit and a central axis of the gas injection holes.

12. The substrate processing apparatus of claim 4, wherein the gas supplier comprises a controller to control supply of the source gas or the reaction gas to the projection and the main injection unit and a controller to control a carrier gas, and the carrier gas may be an inert gas or N2 gas.

* * * * *